(12) United States Patent
Heiligenstein

(10) Patent No.: US 10,278,265 B2
(45) Date of Patent: Apr. 30, 2019

(54) HEAT TRACE SIGNAL LIGHT

(71) Applicant: Chromalox, Inc., Pittsburgh, PA (US)

(72) Inventor: Adam Heiligenstein, Gibsonia, PA (US)

(73) Assignee: Chromalox, Inc., Pittsburgh, PA (US)

( * ) Notice: Subject to any disclaimer, the term of this patent is extended or adjusted under 35 U.S.C. 154(b) by 324 days.

(21) Appl. No.: 15/250,272

(22) Filed: Aug. 29, 2016

(65) Prior Publication Data

US 2018/0279450 A1    Sep. 27, 2018

(51) Int. Cl.
| | | |
|---|---|---|
| *H05B 37/02* | (2006.01) | |
| *G01R 31/02* | (2006.01) | |
| *G08B 5/36* | (2006.01) | |
| *H02J 9/06* | (2006.01) | |
| *H05B 3/56* | (2006.01) | |
| *H05B 33/08* | (2006.01) | |
| *F16L 53/38* | (2018.01) | |

(Continued)

(52) U.S. Cl.
CPC .......... *H05B 37/0272* (2013.01); *F16L 53/38* (2018.01); *G01R 31/021* (2013.01); *G08B 5/36* (2013.01); *H02J 7/0068* (2013.01); *H02J 7/022* (2013.01); *H02J 9/06* (2013.01); *H05B 3/56* (2013.01); *H05B 33/086* (2013.01); *H05B 33/0815* (2013.01); *H05B 33/0842* (2013.01); *H05B 33/0845* (2013.01); *H02J 7/345* (2013.01)

(58) Field of Classification Search
CPC .. H05B 37/0272; H05B 3/56; H05B 33/0815; H05B 33/0842; H05B 33/0845; H05B 33/086; F16L 53/38; G01R 31/021; G08B 5/36; H02J 7/0068; H02J 7/022; H02J 9/06; H02J 7/345

USPC .......... 340/538, 588, 596, 640, 655, 815.66, 340/815.45; 219/494, 517, 535
See application file for complete search history.

(56) References Cited

U.S. PATENT DOCUMENTS

| | | | | |
|---|---|---|---|---|
| 4,250,400 A | * | 2/1981 | Lee | H05B 3/56 |
| | | | | 174/541 |
| 4,453,159 A | * | 6/1984 | Huff | G01K 3/005 |
| | | | | 200/61.08 |

(Continued)

FOREIGN PATENT DOCUMENTS

| | | |
|---|---|---|
| EP | 3057380 A1 | 8/2016 |
| WO | WO 2015/187170 A1 | 12/2015 |

OTHER PUBLICATIONS

International Search Report and Written Opinion for Application No. PCT/US2017/048145 dated Oct. 26, 2017 (15 pages).

*Primary Examiner* — Jimmy Chou
(74) *Attorney, Agent, or Firm* — K&L Gates LLP

(57) ABSTRACT

An improved signal light unit for heat trace cables includes an energy storage device that stores energy during normal operation of the heat trace cable. During the normal operation, the light source of the signal light unit has a first illumination status. When there is a fault or other type of interruption in the electrical power in the heat trace cable, the energy storage device can discharge to power the light source. The light source can be illuminated in a different manner when it is powered by the energy storage device than during normal operation. Keeping the light energized in this manner when there is a fault in the heat trace cable and, moreover, making the light illuminate differently when there is a fault compared to normal operation, will facilitate inspection of the facility in which the heat trace cable is installed.

20 Claims, 6 Drawing Sheets

(51) Int. Cl.
*H02J 7/00* (2006.01)
*H02J 7/02* (2016.01)
*H02J 7/34* (2006.01)

(56) References Cited

U.S. PATENT DOCUMENTS

| | | | | |
|---|---|---|---|---|
| 4,575,617 A * | 3/1986 | Cooper | ............... | G05D 23/1906 219/494 |
| 4,650,971 A | 3/1987 | Manecci et al. | | |
| 4,751,495 A * | 6/1988 | Whitman | ............... | G01K 1/024 137/59 |
| 4,891,500 A * | 1/1990 | Bloore | ................. | H05B 3/56 219/483 |
| 5,182,427 A * | 1/1993 | McGaffigan | ........... | H05B 6/101 219/494 |
| 5,512,732 A * | 4/1996 | Yagnik | .................... | H05B 3/56 219/504 |
| 7,917,339 B2 * | 3/2011 | Bourgeois | ............... | G06F 17/50 703/1 |
| 2007/0108176 A1 * | 5/2007 | Ellis | ........................ | H05B 3/50 219/228 |
| 2007/0119848 A1 * | 5/2007 | Ellis | ........................ | H05B 3/50 219/541 |
| 2009/0179022 A1 * | 7/2009 | Ellis | ........................ | H05B 3/50 219/228 |
| 2011/0163082 A1 * | 7/2011 | Mullen | ................... | H04W 4/70 219/494 |
| 2013/0200707 A1 | 8/2013 | Hartmann | | |
| 2013/0248013 A1 * | 9/2013 | Chakkalakal | ......... | F16L 59/029 137/334 |
| 2014/0190680 A1 * | 7/2014 | Vanthournout | ..... | F24D 19/1063 165/287 |
| 2015/0354779 A1 | 12/2015 | Sherman et al. | | |
| 2016/0016316 A1 | 1/2016 | Fowler | | |
| 2016/0161316 A1 * | 6/2016 | Heiligenstein | .......... | F16L 53/30 73/861.95 |
| 2016/0245447 A1 * | 8/2016 | Crombie | ............... | H04W 84/18 |
| 2017/0238365 A1 * | 8/2017 | Lilleland | ................ | F16L 53/38 219/535 |

\* cited by examiner

HEAT TRACE SIGNAL LIGHT

BACKGROUND

Heat trace systems are commonly used in industrial and commercial settings to maintain or raise the temperature of pipes or tanks in a piping system through the use of heat trace cables comprising electrical heating elements or heat traces that are in physical contact with the pipe or tank, as the case may be. Proper operation of the heat trace cables can be verified by visual inspection sometimes. An employee physically walks around areas having the heat trace cables and inspects lighted towers, often at the end of the respective heat trace cables (and hence sometimes referred to as "end of line" or EOL lights) so that they are lit when the heat trace cables are energized and working properly. Since the EOL lights are on when the heat trace cables are properly energized, the inspecting employee needs to know where to look in the facility in order to notice an EOL light that is turned off in order to notice a heat trace cable that is not functioning properly. If the inspecting employee does not know where to look, he/she might miss the turned-off EOL light, thereby missing the nonfunctioning heat trace cable.

SUMMARY

In one general aspect, the present invention is directed to an improved signal light unit for heat trace cables. The signal light unit can be an EOL signal light, for example. The signal light unit includes an energy storage device, such as a supercapacitor or rechargeable battery, that stores energy during normal operation of the heat trace cable. During the normal operation, the light source of the signal light unit has a first illumination status, such as constantly on (or illuminated). When there is a fault or other type of interruption in the electrical power in the heat trace cable, the energy storage device can discharge to power the light source. Moreover, the light source can be illuminated in a different manner when it is powered by the energy storage device than during normal operation. For example, when the light source is powered by the energy storage device, it can blink or emit a different color of light or emit light of a different intensity or a combination of these things, in comparison to normal operation. Keeping the light energized in this manner when there is a fault in the heat trace cable and, moreover, making the light illuminate differently when there is a fault compared to normal operation, will facilitate inspection of the facility in which the heat trace cable is installed.

These and other benefits of the present invention will be apparent from the description that follows.

FIGURES

Various embodiments of the present invention are described herein by way of example in connection with the following figures, wherein.

DESCRIPTION

Figure 1:
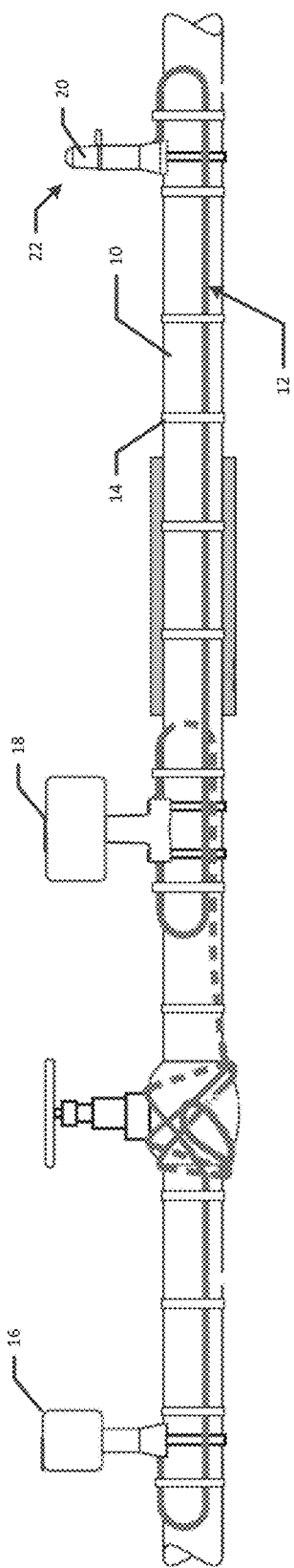
FIG. 1 is a diagram of a pipe with a heat trace cable according to various embodiments of the present invention.

FIG. 1 is a diagram of a pipe 10 in a facility that has a heat trace cable 12 for heating or maintaining the temperature of the pipe 10. The heat trace cable 12 is attached to the pipe 10 in strategic places (usually toward the bottom of the pipe 10) by glass tape 14 or other suitable connectors. A power connection kit 16 connects the heat trace cable bus wires (described further below) to electrical power supplied from a ground-fault protected, typically AC, power supply (not shown). A tee or splice 18 can accommodate pipe branches to connect two or three heat trace cables together. A facility where the heat trace cable 12 is installed may include many such pipes 10 and heat trace cables 12, although one of each is shown in FIG. 1 for purposes of simplicity and clarity.

Importantly for the present invention, the heat trace cable 12 may also include a signal light unit that comprises one or more light sources, such that light emitted from the light source(s) can be used in a visual inspection of the heat trace cable 12. In various embodiments, the signal light unit 20 can be included in a termination unit 22 at the end of the heat trace cable 12. The signal light unit 20 can be powered by electricity conducted by the heat trace cable 12 in normal operation so that the light source(s) of the signal light unit 20 is illuminated in one manner when the heat trace cable 12 is energized (a first operating mode) and illuminated in another manner when heat trace cable 12 is not energized (or insufficiently energized) (a second operating mode). For example, the signal light unit 20 can stay on constantly when the heat trace cable 12 is energized but blink according to a predefined blinking pattern when the heat trace cable 12 is not energized; or the signal light 20 can emit light of a first color (e.g., green) when the heat trace cable 12 is energized but emit light of a second color (e.g., red) when the heat trace cable 12 is not energized. As such, the illumination status of signal light unit 20 can indicate whether the heat trace cable 12 is energized or not. Maintenance personnel can walk around the facility to check whether the signal lights 20 for the various heat trace cables 12 in the facility are illuminated (or not) in order to assess whether the heat trace cables 12 are functioning properly. The light sources of the signal light unit 20 can be incandescent bulbs or LEDs, for example, and preferably are bright enough to be visible in daylight or a lighted facility. If there is a fault in a heat trace cable 12, its associated signal light unit 20 can change its illumination status, thereby indicating a problem in the associated heat trace cable 12.

Various aspects of the present invention, therefore, are directed to improved heat trace cable signal lights, including signal lights that flash when there is a problem with the heat trace cable or that emit different color light and/or intensity than the light or intensity that is emitted during normal operation of the heat trace cable. Before describing such inventive heat trace cable signal lights, a description is provided of an exemplary heat trace cable for which embodiments of the present invention could be utilized.

Figure 2:
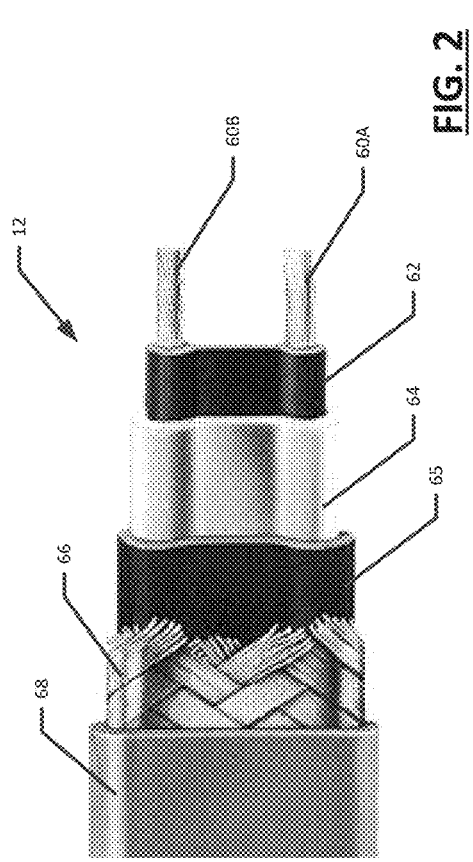
FIG. 2 is a diagram of a heat trace cable according to various embodiments of the present invention.

As shown in the example of FIG. 2, an exemplary heat trace cable 12 may include two buss wires 60A, 60B surrounded by a conductive matrix 62 (which is preferable polymeric). The conductive matrix 62 in turn may be surrounded by inner and outer thermojackets 64, 65, which in turn may be surrounded by a metallic (e.g., tinned copper) braid 66 and a thermoplastic overcoat 68 (preferably Teflon) over the braid 66. The buss wires 60A, 60B carry electrical current from the power source of a main power distribution and control system. Heat from the heat trace cable 12 heats (or maintains the temperature of) the pipe section 10 (see FIG. 1) or tank that it contacts to offset any losses in the pipe or tank temperature. More details about the heat trace cables can be found in published United States patent application Pub. No. 2016/016316, entitled "Powering Sensors in a Heat Trace System," filed Jan. 15, 2016 by applicant Chromalox, Inc., which is incorporated herein by reference in its entirety.

Figure 3:
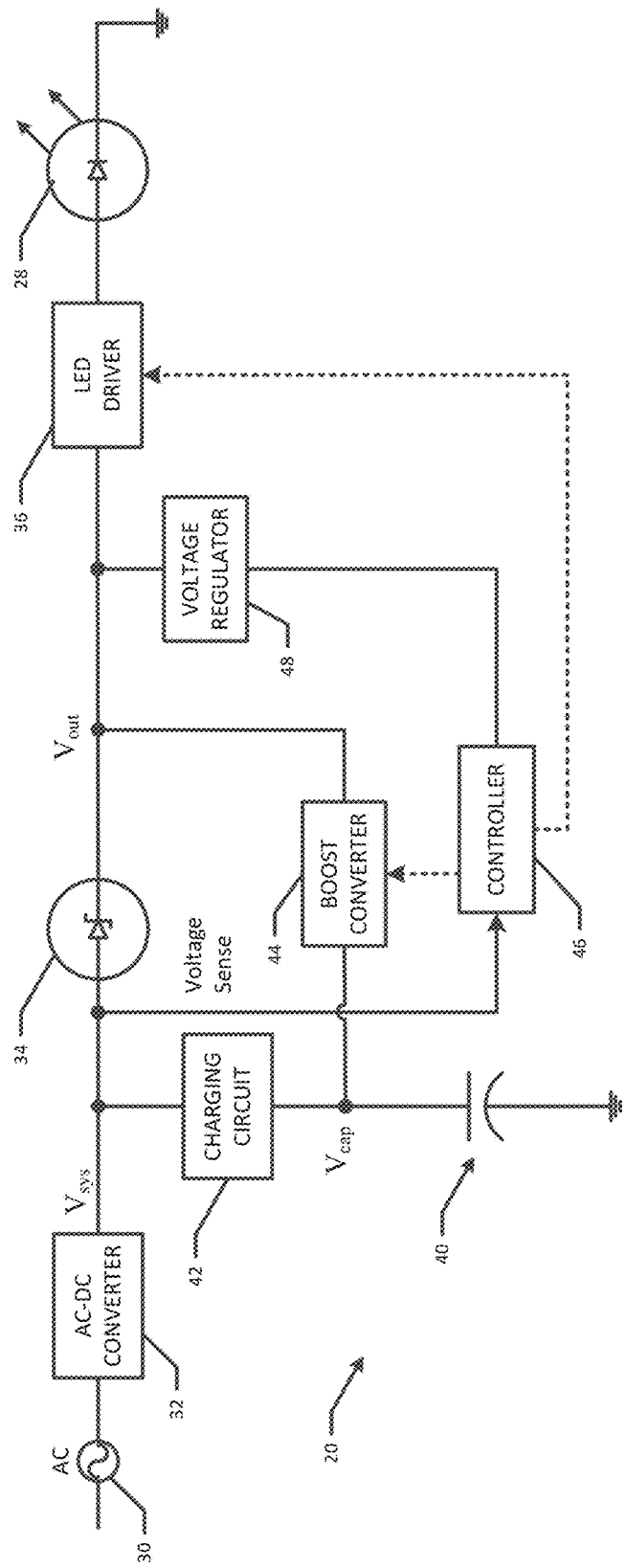
FIGS. 3-7 are diagrams of a heat trace cable signal light unit according to various embodiments of the present invention.

FIG. 3 is a circuit diagram of a signal light unit 20 for a heat trace cable according to various embodiments of the present invention. In the embodiment shown in FIG. 3, the signal light unit 20 comprises one or more like LEDs 28 (e.g., an LED string) at the end of the heat trace cable (e.g., the light is a EOL light) that receives electrical power from the bus wires of the heat trace cable, indicated by the AC power source 30 in the example of FIG. 3. The AC voltage from the bus wires is converted to a DC voltage, Vsys, by an AC-DC converter 32. The output of the AC-DC converter 32 can be connected to a diode, such as a schottky diode 34. The schottky diode 34 has a forward voltage drop (e.g., 0.3V), thereby producing an output voltage, Vout, that is supplied to a LED driver 36 that drives the LED 28. As such, when the bus wires of the heat trace cable are energized, the AC source 30 in FIG. 3 will supply AC voltage to the AC-DC converter 32, such that the AC-DC converter 32 produces a sufficiently high DC voltage, e.g., Vsys=5.3 V, to drive the LED 28 (after the forward voltage drop of the schottky diode 34) such that the LED 28 is energized illuminated when the AC power source 30 (i.e., the heat trace cable 12) is sufficiently energized.

In various embodiments, the LED 28 is energized in a different manner even when the heat trace cable (e.g., the AC power source 30 in FIG. 3) does not provide sufficient power to energize the LED 28. This can be accomplished through an energy storage device, such as the supercapacitor 40 in FIG. 3, that stores energy during normal operation and discharges to power the LED 28 when Vsys drops below a threshold value. Supercapacitors are sometimes referred to synonymously as ultracapacitors or electric double-layer capacitors (EDLCs). During normal operation (e.g., when the AC power source 30 is supplying normal power), the supercapacitor 40 is charged by a charging circuit 42 to a voltage, Vcap, that is less than Vsys, e.g., one-half of Vsys (e.g., Vcap=2.65V and Vsys=5.3V). If Vsys drops below a threshold voltage (e.g., 5.3V), a switch-mode power supply, such as a boost converter 44, starts switching to convert Vcap to Vout to maintain Vout at the desired level (e.g., 5.0V). The schottky diode 34 prevents current flow from Vout to Vsys in this circumstance.

The charging circuit 42 may comprise, in various embodiments, a N-MOSFET and a programmable shunt regulator (not shown) that limit the supercapacitor voltage Vcap to the desired value when the supercapacitor 40 is fully charged. The charging circuit 42 may also comprise a schottky diode (not shown) that prevents reverse current when Vsys is at a low voltage (e.g., less than Vcap).

The signal light unit 20 may also include a controller 46 that controls operation of the boost converter 44 and the LED driver 36. The controller 46 can control the regulation voltage of the boost converter 44 so that it produces Vout (e.g., 5V) when Vsys drops below the desired value (e.g., Vout plus the forward voltage drop of diode 34).

The controller 46 also controls the LED driver 36. To that end, the controller 46 can receive a voltage sense signal that senses the voltage level of Vsys. When Vsys is at the desired level (e.g., Vout plus the forward voltage drop of diode 34), the controller 46 can control the LED driver 36 so that the LED 28 is on, indicating normal operation (e.g., no interruption in the AC power 30 from the heat trace bus wires). On the other hand, when Vsys is below the desired threshold value, the controller 46 can control the LED driver 36 so that, for example, the LED 28 blinks according to a predetermined blinking pattern to indicate a fault or interruption in the AC power for the heat trace cable. The LED driver 36 and LED 28 are powered under such circumstances by the boost converter output voltage as described above.

Figure 4:
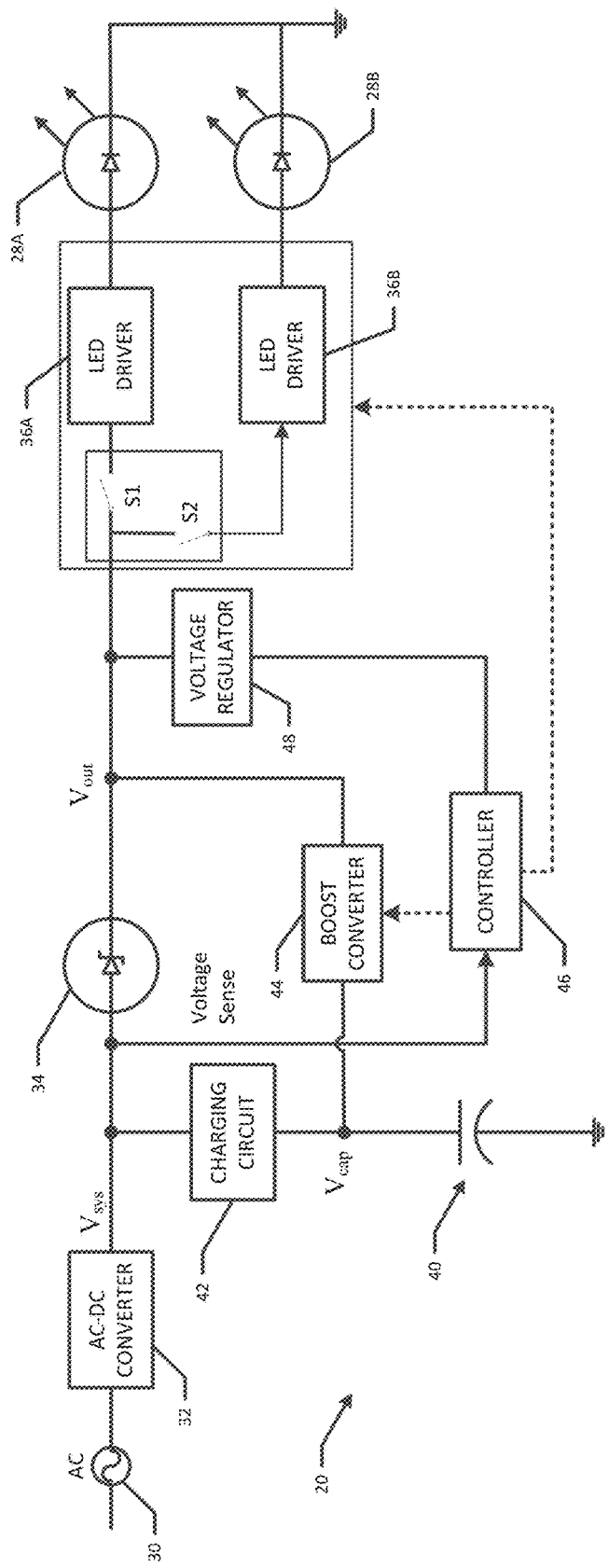

In another embodiment, as shown in FIG. 4, the signal light 20 may comprise multiple LEDs 28A, 28B and multiple LED drivers 36A, 36B. In such an embodiment, as shown in the example of FIG. 4, the LED driver 36A drives the LED 28A and LED driver 36B drives the LED 28B. In such an embodiment, the LEDs 28A, 28B can emit different color light (e.g., Color A emitted by LED 28A and Color B emitted by LED 28B). Under normal operation, when Vsys is at the desired voltage value, the controller 46 can close a switch S1 and open a switch S2 so that Vout is supplied to the LED driver 36A so that the LED 28A emits Color A, indicating the normal operation. On the other hand, when the controller 46 senses that Vsys drops below the desired voltage level, the controller 46 can close the switch S2 and open the switch S1 so that Vout is supplied to the LED driver 36B so that the LED 28B emits Color B, indicating a fault or interruption in the heat trace. The second LEDs 28B could also be more efficient and/or not as bright (lower intensity) than the LEDs 28A to conserve power during the time that the supercapacitor 40 is powering the LEDs 28B than when Vsys powers the LEDs 28A.

Referring back to FIG. 3, in another embodiment the LED 28 could be a color changing LED. The controller 46 can control the LED driver 36 so that the LED 28 emits a first color (e.g., green) during normal operation and a second color (e.g., red) when there is a fault or interruption in the heat trace cable.

As shown in FIGS. 3 and 4, the circuit may also comprise a voltage regulator 48 for generating a voltage to power the controller 46. Also, in various embodiments, the controller 46 may be implemented with one or multiple, discrete integrated circuits, such as one controller IC for controlling the boost converter 44 and another controller IC for controlling the LED driver 36 (or drivers 36A, 36B). In addition, the controller for the boost converter may be integrated into an IC with the boost converter and/or the controller for the LED driver 36 could be integrated into the LED driver. Also, the circuit could comprise other components, such as an output capacitor (not shown) in order to deal with pulse currents supplied to the output LEDs.

Figure 5:
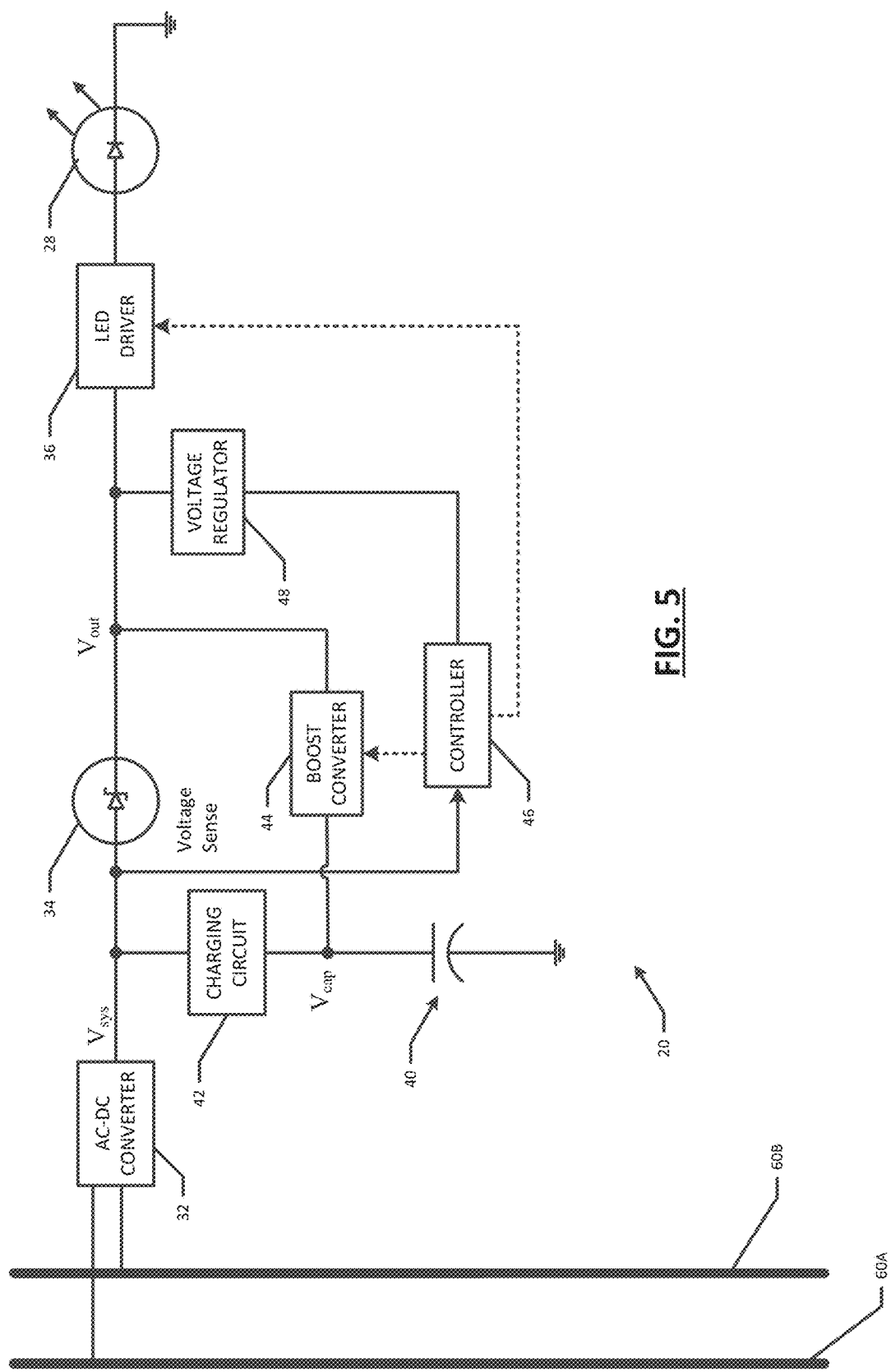

In the embodiment of FIGS. 3 and 4, the output LED 28 was at the end of the heat trace cable. In other embodiments, the signal light unit 20 could be powered by an intermediate point of the heat trace bus wires, as shown in the example embodiment of FIG. 5. The signal light unit 20 of FIG. 5 is similar to that of FIG. 3, except that it is tapped off an intermediate point of the bus wires 60A, 60B. As such, the AC-DC converter 32 converts the AC voltage differential across the bus wires 60A, 60B to the DC voltage Vsys for powering the LED 28. The embodiment of FIG. 5 could also utilize output LEDs 28A, 28B that emit different colors, as in the example embodiment of FIG. 4, or utilize a color-changing LED, etc.

Figure 6:
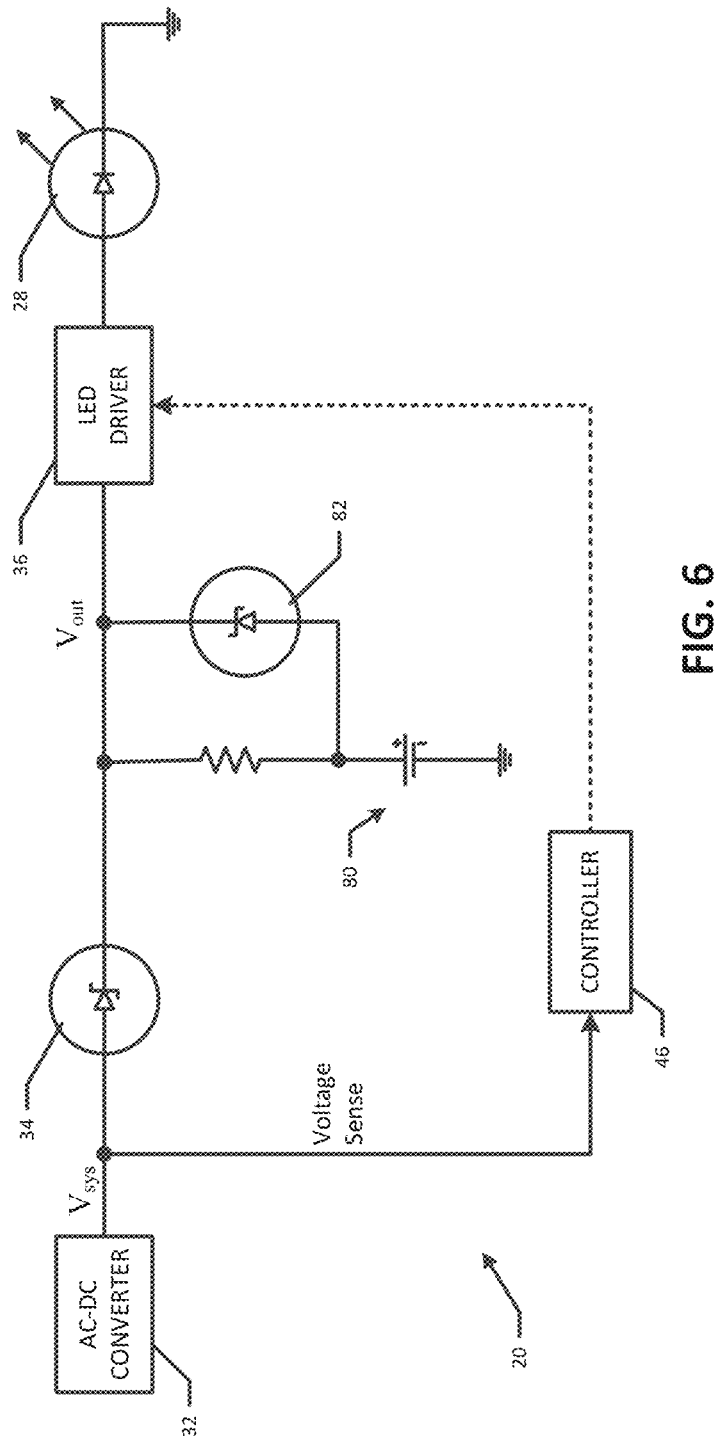

In the embodiments of FIGS. 3 through 5, the supercapacitor 40 stored energy during normal operation in order to power the signal light 20 when there was fault or interruption in the heat trace cable. In other embodiments, different types of energy storage devices could be used, such as a rechargeable battery 80, as shown in the example of FIG. 6. During normal operation, the output of the AC-DC converter 32 powers the LED driver 36 and the LED 28, as well as charges the rechargeable battery 80. When the output of the AC-DC converter 32 drops below the desired, threshold voltage level, the schottky diode 34 is reversed biased and the diode 82 is forward biased, such that the rechargeable battery 80 powers the load.

Figure 7:
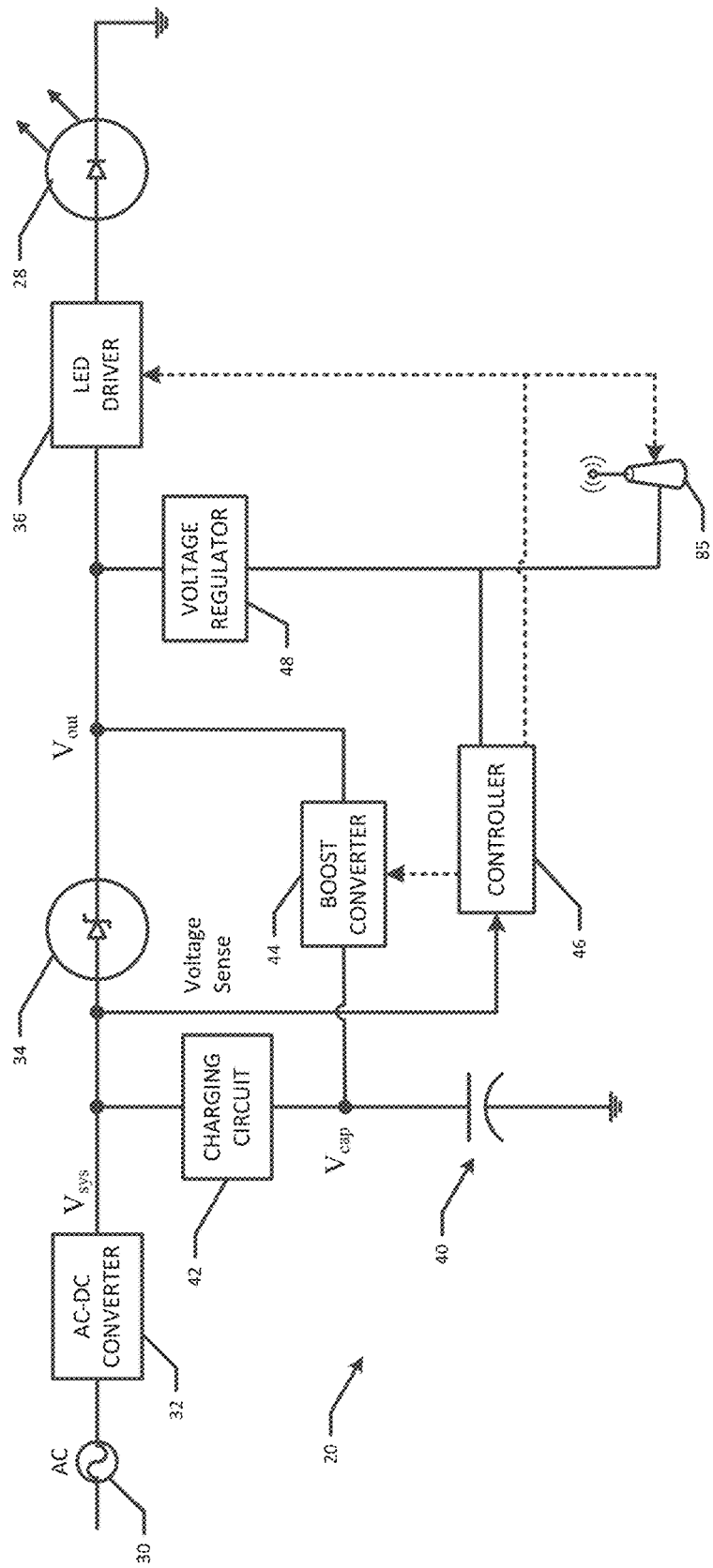

In various embodiments, the signal light unit may also comprise a wireless transmitter that communicates wirelessly with a remote receiver. For example, the remote receiver could be part of a control system for the heat trace cable and the wireless transmitter of the signal light unit could communicate to the remote receiver the power status of the heat trace cable. That way, when there is an interruption in the power on the heat trace, the wireless transmitter may transmit a status signal back to the heat trace control system that there is interruption (or other detected fault) in the heat trace cable. FIG. 7 illustrates an example of such an embodiment. The controller 46 monitors the output voltage, Vsys, of the AC-DC converter 32 via the voltage sense line. The controller 46 can periodically transmit messages, via the wireless transmitter 85, to the remote heat trace cable control system (not shown) that informs the heat trace cable control system of the AC-DC converter output voltage level. That way, when the AC-DC converter output voltage drops below the desired value, the heat trace cable control system is notified of the voltage drop and appropriate action can be taken. In other embodiments, instead of transmitting periodic status updates, the controller 46 and wireless transmitter 85 can transmit messages to the remote heat trace cable control system from time to time, such as upon the occurrence of a triggering event, such as the output voltage of the AC-DC converter 32 dropping below the desired value.

The wireless transmitter 85 may be powered by the voltage from the voltage regulator 48. The wireless transmitter 85 and the remote heat trace cable control system may communicate using any suitable wireless communication protocol or channel, such as WiFi (IEEE 802.11), Zigbee (IEEE 802.15.4), ISA-100.11, WirelessHart, or any other suitable wireless standard or protocol.

More details about wireless communications involving a remote heat trace cable control system can be found in (1) U.S. patent application Pub. No. 2016/0245447, entitled "Wireless Modules with Power Control Circuits for Heat Trace System," filed Feb. 19, 2015 by applicant Chromalox., Inc., and (2) published United States patent application Pub. No. 2016/0161316, entitled "Powering Sensors in a Heat Trace System," filed Jan. 15, 2016 by applicant Chromalox, Inc., both of which are incorporated herein by reference in their entirety respectively.

The heat trace cable can conduct AC current or DC current. In embodiments where DC current is used, the AC-DC converter 32 can be replaced with a suitable DC-DC converter.

In one general aspect, therefore, the present invention is directed to an apparatus that comprises a heat trace cable 12 and a signal light unit 20 connected to the heat trace cable 12. The heat trace cable 12 comprises a pair of bus wires 60A, 60B and the signal light unit 20 is powered by a voltage difference across the pair of bus wires 60A, 60B. The signal light unit 20 can comprise a light source 28; a voltage converter 32 for converting the voltage difference across the pair of bus wires 60A, 60B to a first voltage; and an energy storage device 40, 85 that is charged by an output voltage of the voltage converter 32. The light source 28 is connected to the voltage converter 32 and the energy storage device 40, 85 such that the light source 28 is powered by an output of the voltage converter 32 in a first operating mode corresponding to when the first voltage is at or above a threshold voltage and is powered by the energy storage device 40, 85 in a second operating mode corresponding to when the first voltage is below the threshold voltage. The light source 28 has a first illumination status in the first operating mode and a second illumination status in the second operating mode.

In various implementations, the energy storage device can comprise a supercapacitor or an ELDC or a rechargeable battery. The first and second illumination statuses could comprise one or a combination of the following different conditions:

| 1st ILLUMINATION STATUS | 2nd ILLUMINATION STATUS |
|---|---|
| Always on | Blinking |
| First Color | Second (different) Color |
| First Intensity | Second (different) Intensity |

The light source 28 may comprise one or more incandescent bulbs or LEDs (e.g., a string of LEDs) or a color-changing LED. The voltage converter can be connected to an end of the heat trace cable or tapped off the heat trace cable at an intermediate point or juncture. The signal light unit could also comprise a wireless transmitter that, for example, transmits wirelessly data indicative of the output voltage of the voltage converter 32.

While various embodiments have been described herein, it should be apparent that various modifications, alterations, and adaptations to those embodiments may occur to persons skilled in the art with attainment of at least some of the advantages. The disclosed embodiments are intended to include all such modifications, alterations, and adaptations without departing from the scope of the embodiments as set forth herein. For example, in certain circumstances a single component disclosed herein may be replaced by multiple components and multiple components may be replaced by a single component to perform a given function or functions. Except where such substitution would not be operative, such substitution is within the intended scope of the embodiments.

What is claimed is:
1. An apparatus comprising
a heat trace cable that comprises a pair of bus wires; and
a signal light unit connected to the heat trace cable, wherein the signal light unit is powered by a voltage difference across the pair of bus wires and wherein the signal light unit comprises:
a light source;
a voltage converter for converting the voltage difference across the pair of bus wires to a first voltage; and
an energy storage device that is charged by an output voltage of the voltage converter;
wherein:
the light source is connected to the voltage converter and the energy storage device;
the light source is powered by an output of the voltage converter in a first operating mode corresponding to when the first voltage is at or above a threshold voltage;
the light source is powered by the energy storage device in a second operating mode corresponding to when the first voltage is below the threshold voltage;
the light source has a first illumination status in the first operating mode; and
the light source has a second illumination status in the second operating mode.

2. The apparatus of claim 1, wherein the energy storage device comprises a supercapacitor.

3. The apparatus of claim 1, wherein the energy storage device comprises a rechargeable battery.

4. The apparatus of claim 1, wherein:
the first illumination status is that the light source emits light constantly; and
the second illumination status is that the light source emits light according to a blinking pattern.

5. The apparatus of claim 1, wherein:
the first illumination status is that the light source emits light of a first color; and
the second illumination status is that the light source emits light of a second color that is different from the first color.

6. The apparatus claim 5, wherein:
the light source comprises a first LED and a second LED;
the first LED emits light of the first color;
the second LED emits light of the second color;
the first LED is illuminated in the first operating mode; and
the second LED is illuminated in the second operating mode.

7. The apparatus of claim 1, wherein:
the first illumination status is that the light source emits light at a first intensity; and
the second illumination status is that the light source emits light of a second intensity that is different from the first intensity.

8. The apparatus of claim 1, wherein the voltage converter is connected to an end of the heat trace cable.

9. The apparatus of claim 1, wherein the voltage converter is tapped off the pair of bus wires of the heat trace cable.

10. The apparatus of claim 1, wherein:
the pair of bus wires conduct AC current; and
the voltage converter comprises an AC-to-DC converter.

11. The apparatus of claim 10, wherein the AC-to-DC converter is connected to an end of the heat trace cable.

12. The apparatus of claim 10, wherein the AC-to-DC converter is tapped off the pair of bus wires of the heat trace cable.

13. The apparatus of claim 1, wherein the light source comprises one or more LEDs.

14. The apparatus of claim 1, wherein the light source comprises an incandescent bulb.

15. The apparatus of claim 1, wherein the signal light unit comprises a wireless transmitter.

16. The apparatus of claim 15, wherein the wireless transmitter is for transmitting wirelessly data indicative of output voltage of the voltage converter.

17. An apparatus comprising
a heat trace cable for conducting electrical current; and
a signal light unit connected to the heat trace cable, wherein the signal light unit comprises:
a light source;
voltage conversion means that is connected to the light source, wherein the voltage conversion means are for converting a voltage difference across a pair of wires of the heat trace cable to a first voltage, such that the light source is powered by an output of the voltage conversion means in a first operating mode of the signal light unit corresponding to when the first voltage is at or above a threshold voltage; and
energy storage means that is connected to the light source and the voltage conversion means, wherein the energy storage means is for:
charging during the first operating mode; and
powering the light source in a second operating mode of the signal light unit corresponding to when the first voltage is below the threshold voltage,
wherein:
the light source has a first illumination status in the first operating mode; and
the light source has a second illumination status in the second operating mode.

18. The apparatus of claim 17, wherein:
the light source comprises at least one LED; and
the energy storage means comprises a supercapacitor.

19. A signal light unit for a heat trace cable, the signal light unit comprising:
a light source;
a voltage converter for converting a voltage difference across a pair of bus wires of the heat trace cable to a first voltage; and
an energy storage device that is charged by an output voltage of the voltage converter;
wherein:
the light source is connected to the voltage converter and the energy storage device;
the light source is powered by an output of the voltage converter in a first operating mode corresponding to when the first voltage is at or above a threshold voltage;
the light source is powered by the energy storage device in a second operating mode corresponding to when the first voltage is below the threshold voltage;
the light source has a first illumination status in the first operating mode; and
the light source has a second illumination status in the second operating mode.

20. The signal light unit of claim 19, wherein:
the light source comprises at least one LED; and
the energy storage means comprises a supercapacitor.

* * * * *